United States Patent
Hotomi

(10) Patent No.: US 6,198,203 B1
(45) Date of Patent: *Mar. 6, 2001

(54) PIEZOELECTRIC VIBRATING MEMBER AND ITS PRODUCING PROCESS

(75) Inventor: Hideo Hotomi, Nishinomiya (JP)

(73) Assignee: Minolta Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/838,717

(22) Filed: Apr. 9, 1997

(30) Foreign Application Priority Data

Apr. 12, 1996 (JP) .................................... 8-090873

(51) Int. Cl.⁷ .................................................. H01L 41/04
(52) U.S. Cl. ............................................................ 310/324
(58) Field of Search .................................. 310/324, 328, 310/330–332; 347/68–72

(56) References Cited

U.S. PATENT DOCUMENTS

| | | | |
|---|---|---|---|
| 4,584,590 | * 4/1986 | Fischbeck et al. | 346/140 R |
| 4,642,508 | * 2/1987 | Suzuki et al. | 310/324 |
| 5,281,888 | * 1/1994 | Takeuchi et al. | 310/366 |
| 5,376,856 | * 12/1994 | Takeuchi et al. | 310/328 |
| 5,376,857 | * 12/1994 | Takeuchi et al. | 310/328 |
| 5,475,279 | * 12/1995 | Takeuchi et al. | 310/328 |
| 5,510,819 | * 4/1996 | Fujimoto et al. | 346/140 R |
| 5,512,793 | * 4/1996 | Takeuchi et al. | 310/328 |
| 5,517,076 | * 5/1996 | Takeuchi et al. | 310/324 |
| 5,637,126 | * 6/1997 | Ema et al. | 65/31 |
| 5,802,686 | * 9/1998 | Shimada et al. | 347/70 |
| 5,814,920 | * 9/1998 | Takeuchi et al. | 310/328 |

FOREIGN PATENT DOCUMENTS 7-060960  3/1995 (JP) .

* cited by examiner

*Primary Examiner*—Nestor Ramirez
*Assistant Examiner*—Peter Medley
(74) *Attorney, Agent, or Firm*—Sidley & Austin

(57) ABSTRACT

A piezoelectric actuator 52 is produced by providing a common electrode 22 on one planar surface of a thin vibrating plate 20 of non-piezoelectric material, providing a slurry 28 prepared by dispersing a calcined powder of piezoelectric material in a solvent containing dissolved coupling agent on the common electrode, drying the slurry to produce a flexible green sheet 30, pressure molding the green sheet to produce a plurality of precursor members 34 arranged at a predetermined space, sintering the precursor members and thereby growing piezoelectric particles to produce unpolarized piezoelectric members 24, forming individual electrodes on the piezoelectric members to oppose the common electrode, and polarizing the piezoelectric members.

7 Claims, 5 Drawing Sheets

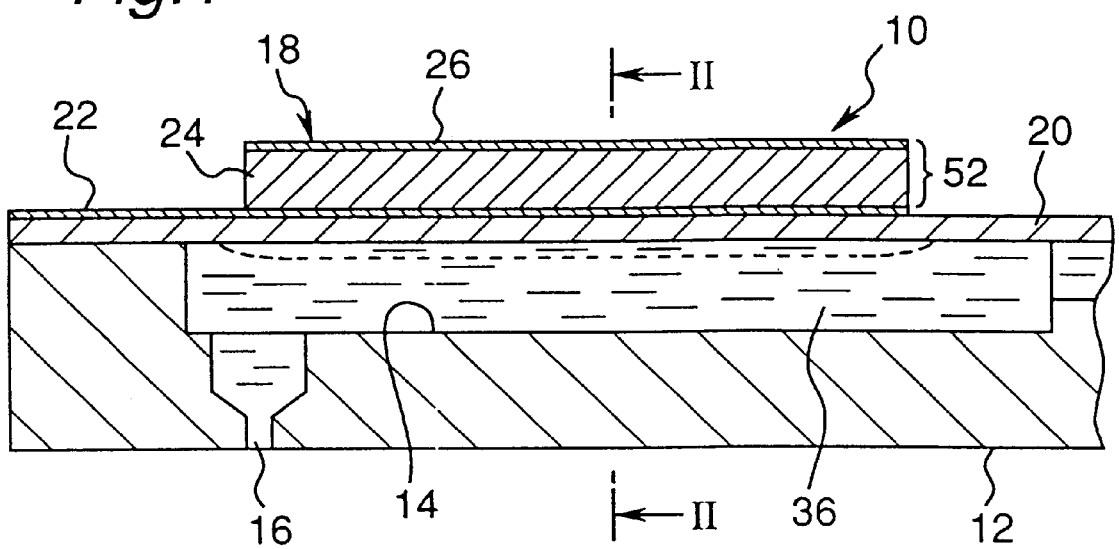
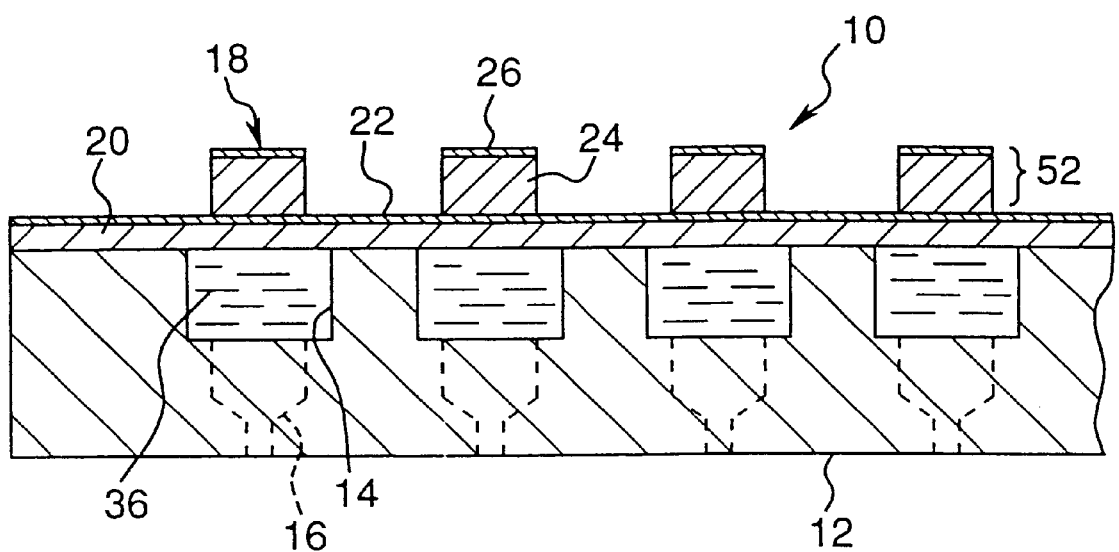

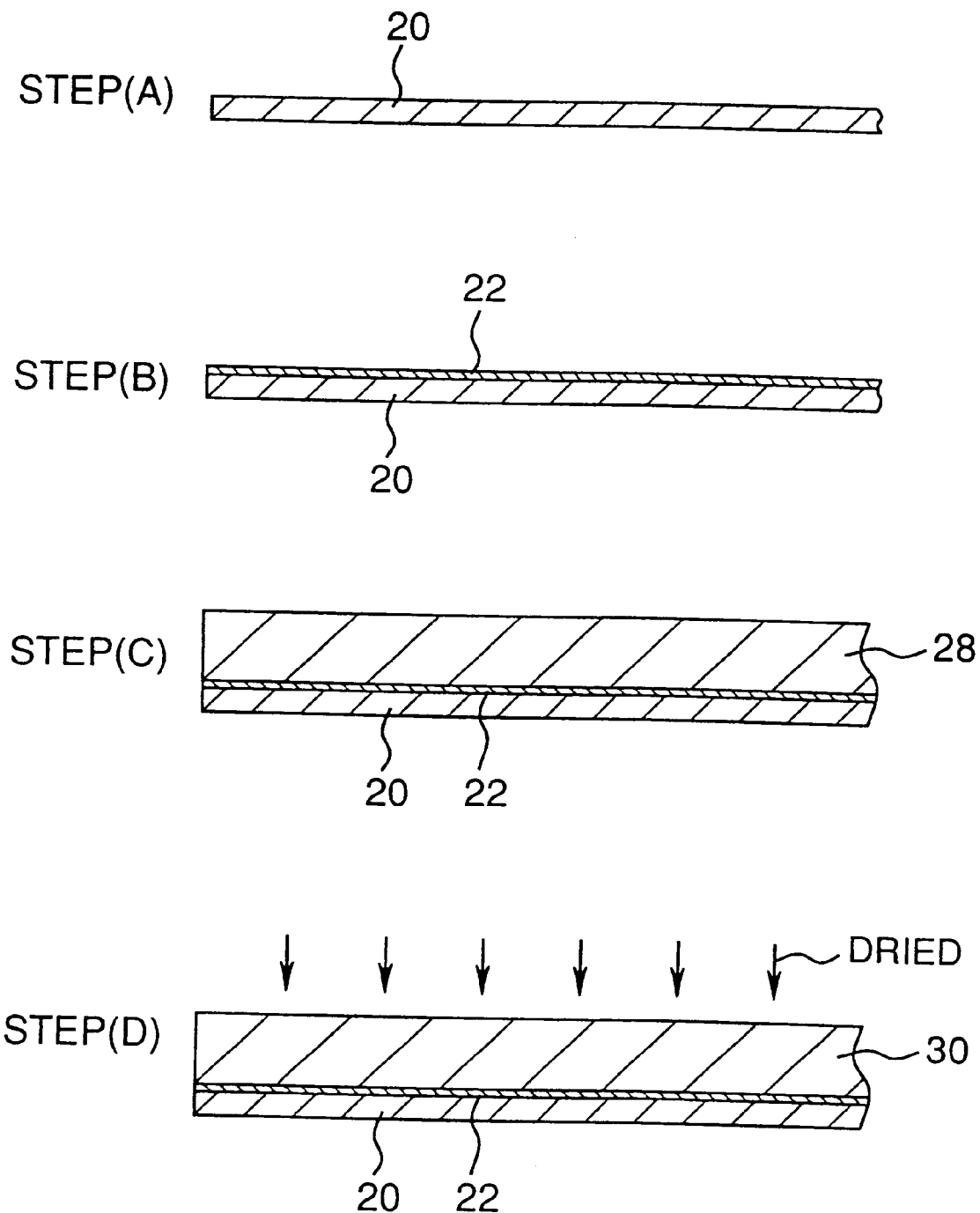

PIEZOELECTRIC VIBRATING MEMBER AND ITS PRODUCING PROCESS

FIELD OF THE INVENTION

The present invention relates to a piezoelectric vibrating member for, according to a displacement thereof, pressuring ink accommodated in an ink cavity to eject an ink droplet, for use in a Drop-On-Demand ink-jet recording head, and a process of producing the piezoelectric member.

BACKGROUND OF THE INVENTION

There has been known a process of producing a piezoelectric vibrating member for use in a Drop-On-Demand ink-jet recording head, in which common and individual electrodes are provided on opposite major surfaces of a plate of piezoelectric material, respectively, cutting the plate into the form of a comb using a dicing saw to form a plurality of equally spaced piezoelectric actuators, and bonding the piezoelectric actuators onto a vibrating substrate.

The above process, however, takes an increased time in cutting the piezoelectric plate by the dicing saw, which renders the process inefficient. Also, the machined piezoelectric actuators must be fixed at a specific positions on the vibrating substrate with a great precision. However, they are bonded on the substrate using an adhesive, leading an inefficient and inaccurate assembling thereof.

SUMMARY OF THE INVENTION

Accordingly, an object of the invention is to provide a new and useful piezoelectric vibrating member and its producing process, and further to provide an ink-jet recording head which includes such piezoelectric vibrating members.

Another object of the invention is to provide a process for producing a piezoelectric vibrating member, which requires no machining using a dicing saw, thereby resulting in an efficient process for producing the member.

Still another object of the invention is to provide a process for producing a piezoelectric vibrating member, which is capable of efficiently manufacturing the piezoelectric vibrating member with great precision.

A further object of the invention is to provide a process for producing a piezoelectric vibrating member that does not require bonding or complicated assembly.

A still further object of the invention is to provide a piezoelectric vibrating member which is formed with a great precision.

To accomplish the above described objects, a process for producing a piezoelectric vibrating member comprises the steps of:

(a) forming a first electrode on a thin plate;
(b) providing a slurry on the first electrode, the slurry being prepared by dispersing a calcined powder of piezoelectric material in a solvent containing a dissolved coupling agent;
(c) drying the slurry to produce a green sheet;
(d) pressure molding the green sheet to produce a plurality of precursor members arranged at a predetermined space;
(e) sintering the precursor members to produce unpolarized piezoelectric members;
(f) forming second electrodes on the piezoelectric members; and
(g) polarizing the piezoelectric members.

Also, the invention intends to provide a piezoelectric vibrating member formed by the process with a great precision.

According to the producing process of the piezoelectric vibrating member, in the first step (a), the first electrode, e.g., common electrode, is formed on one major surface of the non-piezoelectric thin plate by a well-known coating technique, such as, plating or sputtering. In the second step (b), the slurry is provided by dispersing the calcined powder of piezoelectric material in the solvent containing a dissolved coupling agent by the use of a mold or by a well known doctor blading or tape casting. In the third step (c), the slurry is dried by, for example, infrared heating to produce flexible green sheet. In the fourth step (d), the green sheet is pressure molded by pressing with a mold or punching to produce a plurality of equally spaced precursor members. In the fifth step (e), the precursor members are sintered at a certain temperature to grow piezoelectric particles in the members and thereby to produce unpolarized piezoelectric members. In the sixth step (f), the second electrodes, e.g., individual electrode, are formed by a well-known coating technique, such as, plating, ion-plating, or sputtering, on the piezoelectric members so that they oppose the first electrode through the piezoelectric members. Finally, in the seventh step (g), the piezoelectric members are polarized to be piezoelectric actuators.

As described above, according to the process for producing the piezoelectric vibrating member, neither machining by dicing saw nor bonding of the piezoelectric members and the vibrating substrate, both required in the conventional process, is needed. Thus, the producing process of the present invention allows the piezoelectric members to be produced in a considerably simpler manner and to be efficiently assembled with a great precision.

These and other objects, advantages and features of the invention will become apparent from the following description thereof taken in conjunction with the accompanying drawings which illustrate specific embodiments of the invention.

BRIEF DESCRIPTION OF THE DRAWINGS

In the following descriptions, like parts are designated by like reference numbers throughout the several drawings, wherein:

FIG. 1 is a cross-sectional elevational view of a ink-jet recording head;

FIG. 2 is a cross-sectional elevational view of the ink-jet recording head taken along a line II—II in FIG. 1;

FIG. 3 shows steps (a) to (d) in a process for producing a piezoelectric vibrating member;

DESCRIPTION OF THE PREFERRED EMBODIMENTS

Figure 4:
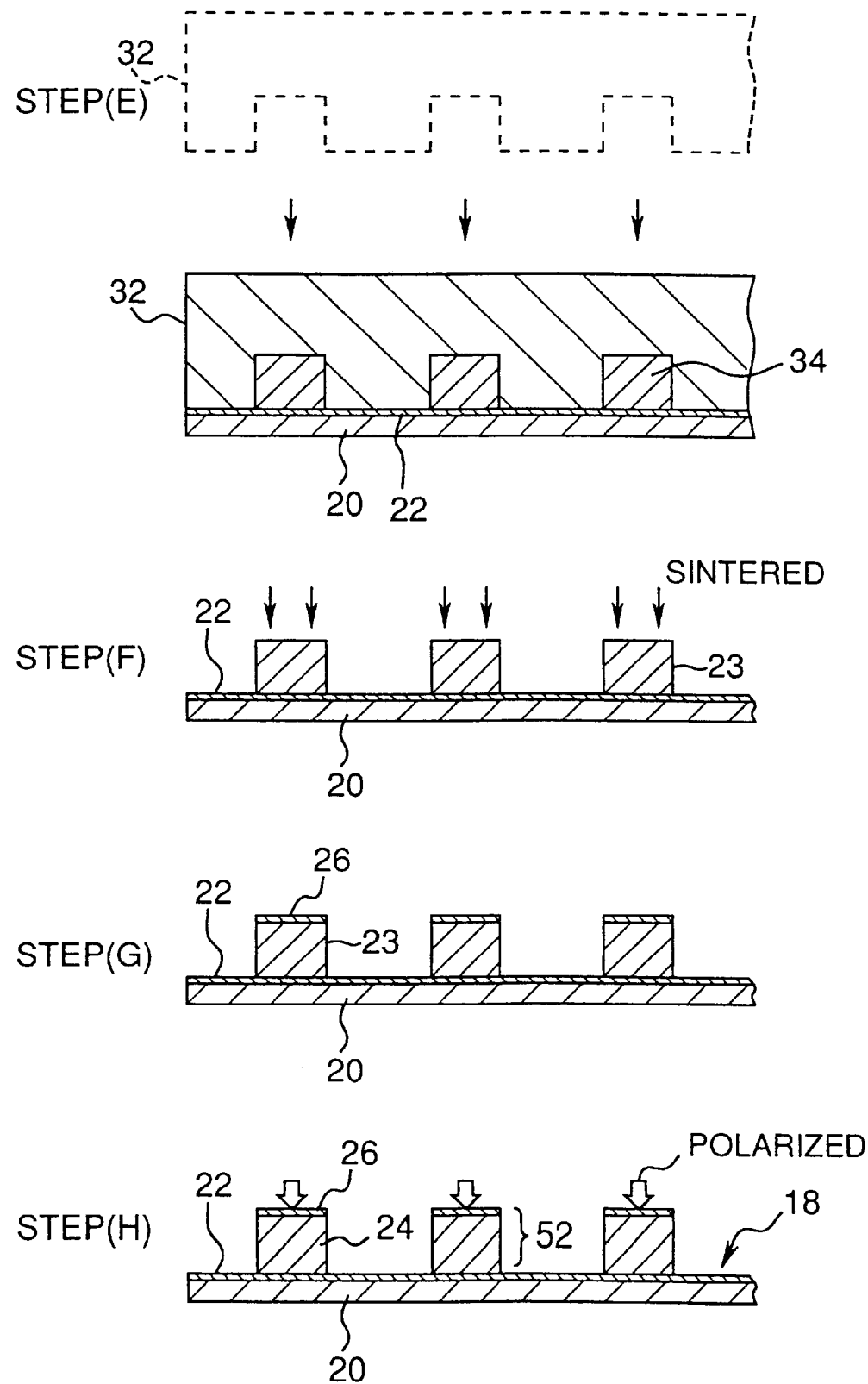
FIG. 4 shows steps (e) to (h) in the process for producing the piezoelectric vibrating member.

An ink-jet recording head comprising preferred embodiments of the invention will be described hereinafter with reference to the drawings. FIGS. 1 and 2 show a partial, enlarged, cross-sectional view of a Drop-On-Demand ink-jet recording head, generally indicated by reference numeral 10. The ink-jet recording head 10 comprises a channel plate 12 having first and second planar surfaces, i.e., upper and lower surfaces. The channel plate 12 is formed in its upper major surface with a plurality of equally spaced elongated grooves, or ink cavities 14, to be filled with ink 36. The channel plate 12 also has a plurality of nozzles 16 for emitting ink-droplets, each of the nozzles 16 being arranged adjacent to one longitudinal end of the cavity 14 to connect between the ink cavity 14 and the lower surface of the channel plate 12. Preferably, the channel plate 12 is made of a non-piezoelectric material such as aluminum. The ink cavities 14 are closed by a piezoelectric vibrating structure 18.

The piezoelectric vibrating structure 18 comprises a thin vibrating plate 20 attached on the upper surface of the channel plate 12 to cover an upper opening of the ink cavities 14, a common electrode 22 extending on an upper surface of the vibrating plate 20, a plurality of elongated piezoelectric members 24, each of which are arranged on the common electrode 22 to oppose a respective one of the ink cavities 14, and individual electrodes 26, each of which are attached to an upper surface of the piezoelectric member 24.

In this arrangement, the common electrode 22, piezoelectric members 24, and individual electrodes 26, cooperate to form a plurality of mutually spaced piezoelectric actuators 52, each of which is capable of deforming the vibrating plate 20, upon application of a voltage between the common and individual electrodes 22 and 26, between a de-energized position indicated by a solid line and an energized position indicated by a dotted line in FIG. 1.

Preferably and advantageously, the piezoelectric vibrating structure 18 is produced by steps (a) to (h) shown in FIGS. 3 and 4. According to this process, in step (a), a thin vibrating plate 20 is provided that is capable of vibrating, and which has opposite major surfaces, i.e., upper and lower surfaces. The vibrating plate 20 is preferably made of nickel, stainless steel, alloys thereof, or piezoelectric material, such as, aluminum oxide and zirconium oxide.

In the step (b), the common electrode 22, preferably made of electrically conductive material, such as nickel, is formed on the upper surface of the vibrating plate 20 by a well-known coating technique, such as plating, printing, or sputtering. The step (b) may be eliminated if the vibrating plate 20 is made of electrically conductive material because then, the vibrating plate 20 can also be used as the common electrode.

In the step (c), a slurry 28, which is a mixture of a calcined powder of piezoelectric material, a coupling agent, a solvent, and, if necessary, a dispersing agent and/or plasticizer, is extended over the common electrode 22 by a mold or by a well-known applying technique, such as doctor-blading. Preferably, the slurry 28 is prepared by dissolving the coupling agent into the solvent, adding the calcined powder of piezoelectric material into the solvent, and mixing them in a mixer, such as a ball mill, to obtain an uniformly dispersed and mixed plastic-flow fluid.

In the step (d), the slurry 28 is dried by, for example, infrared heating to produce a flexible green sheet 30.

In the step (e), the green sheet 30 is formed into a plurality of equally spaced precursor members 34 by pressure molding by the use of a mold 32 machined in detail. At this stage, preferably, ultrasonic waves are applied on the mold 32, thereby the green sheet 32 is filled in all the corners of the mold 32 due to a vibrating energy therefrom.

Advantageously, the ultrasonic waves are applied to the mold when it is released from green sheet 30, allowing the mold 32 to be readily released therefrom.

In the step (f), the precursor members 34, together with the vibrating plate 20, are sintered at a temperature of about 1,100° C. for about two hours in a high temperature furnace, which grows piezoelectric particles in the piezoelectric members and thereby produces unpolarized piezoelectric members 23.

In the step (g), the individual electrodes 26 are formed by a well-known coating technique, such as plating, or sputtering, on the unpolarized piezoelectric members 23 to oppose the common electrode 22 through the unpolarized piezoelectric members 23, respectively.

Finally, in the step (h), the unpolarized piezoelectric members 23, while being heated, are subjected to a high voltage through the common electrode 22 and the individual electrodes 26 and are thereby formed into polarized piezoelectric members 24, which produces a plurality of piezoelectric actuators 52.

Although, in the step (e), the plurality of equally spaced precursors 34 are formed on the vibrating plate 20 by pressuring the mold 32 against the green sheet 30, the precursors 34 may be formed by punching the green sheet 30 instead.

The piezoelectric vibrating structure 18 thus produced is arranged on the channel plate 12 with one of piezoelectric actuators 52 confronting each of the ink cavities 14, respectively, and secured by bonding the vibrating plate 20 to the channel plate 12 using, for example, adhesive (not shown) to eventually form the ink-jet recording head 10. Also, the common electrode 22 and individual electrodes 26 are electrically communicated with a circuit (not shown) for sending out image forming signals. Further, the ink cavity 14 is fluidly communicated with an ink supply (not shown) for supplying the ink cavities 14 with ink 36.

Figure 5:
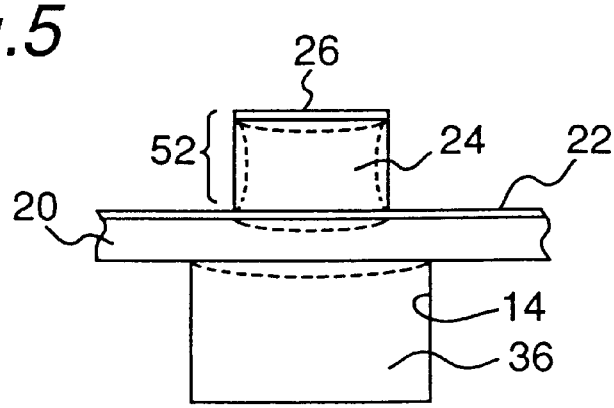
FIG. 5 is a diagram showing a displacement of the piezoelectric vibrating member and a vibrating plate.

In operation of the ink-jet recording head 10 thus assembled, once the image forming signal is supplied from the image forming circuit between the common electrode 22 and individual electrodes 26, an electric field is formed in the piezoelectric member 24, allowing the piezoelectric actuator 52, and in turn a portion of the vibrating plate 20 opposing thereto, to deform from the de-energized position to the energized position illustrated by the dotted line in FIGS. 1 and 5, which forces the ink 36 in the corresponding ink cavity 14 to eventually emit an ink droplet through the nozzle 16. Next, by turning off the signal, the electric field in the piezoelectric member 24 is eliminated, and the piezoelectric actuator 52 and the opposing portion of the vibrating plate 20 return to the de-energized position. This in turn introduce a negative pressure in the ink cavity 14, thus re-charging the ink 36 in the ink cavity 14 from the ink supply.

It is apparent from the above description, each precursor 34 is molded using the machine mold, and therefore the resultant piezoelectric member 24 has precise dimensions and are arranged at a desired position great precision. Further, the piezoelectric member 24 is secured on the vibrating plate 20 during its producing process, not after it is produced, which results in a simplified assembling thereof free from adhesive.

Another embodiment of the recording head will be described below. Note that like reference numbers are provided to like parts in each embodiment and therefore a description therefor will be eliminated. FIG. 6A shows a second embodiment of the recording head, in which the neighboring piezoelectric members 24 are physically connected with each other by a connecting portion 25 which is made of the same material as that of the piezoelectric member 24. The common electrodes 22 are spaced apart from each other to oppose the corresponding ink cavities 14. The piezoelectric vibrating structure or plate 18 is made by using a vibrating plate on which the common electrodes 22 has been pre-patterned in the same manner as that described in the first embodiment, except that the connecting portion 25 is formed by making a corresponding clearance between the vibrating plate and an opposing surface of the mold to leave a portion of the green sheet for the connecting member.

According to this recording head, a discrete common electrode is provided for each piezoelectric member, which significantly decreases so-called cross-talk which would be otherwise occur due to unwanted electric fields possibly formed between one electrode and the neighboring electrode, which can have the effect of energizing the neighboring piezoelectric member to emit an ink-droplet. Also, it is not necessary to remove the portions of the green sheet between the piezoelectric actuators during pressure molding, which simplifies the production of the ink-jet recording head:

Optionally, as shown in FIG. 6B, a vibrating plate 20 which is made of electrically conductive material may be used to replace the discrete common electrodes shown in FIG. 6A.

Figure 7:
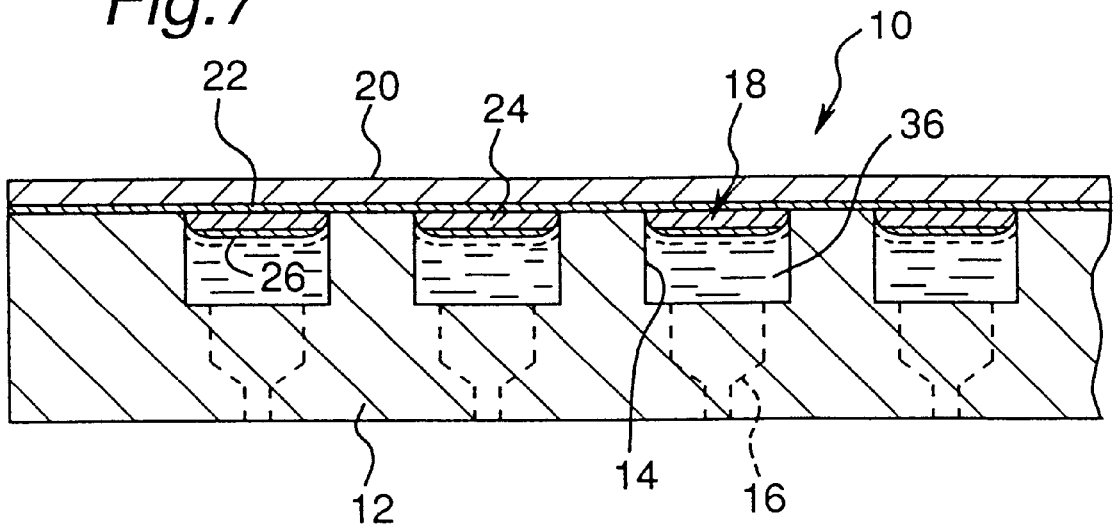
FIG. 7 is a transverse sectional view of the ink-jet recording head of the third embodiment.
Figure 8:
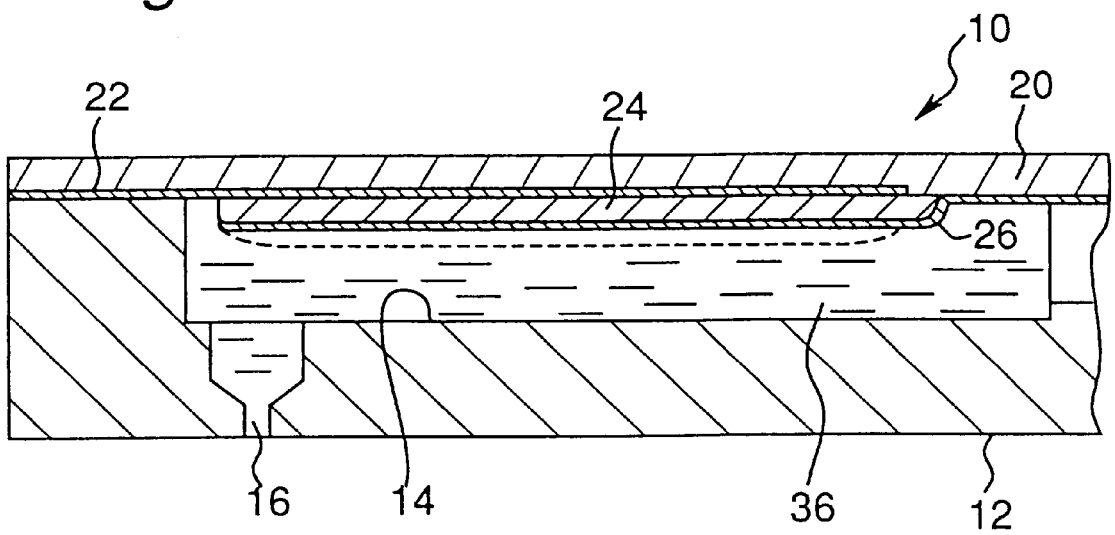
FIG. 8 is a longitudinal sectional view of the ink-jet recording head shown in FIG. 7.

FIG. 7 shows a third embodiment of the recording head of the present invention, in which the piezoelectric actuator 52 is arranged on the side of the ink cavity 14 in contact with the ink 36. The piezoelectric vibrating structure 18 may be produced in the same manner as that in the first embodiment. In this embodiment, as shown in FIG. 8, the common electrode 22 is extended on the lower surface of the vibrating plate 20 to oppose the upper surface of the piezoelectric member 24 from one side, i.e., left side, to and adjacent one end, i.e., right end, of the piezoelectric member 24. The individual electrode 26, on the other hand, is extended on the lower surface of the piezoelectric member 24 from its one end to the other end, i.e., left to right ends, and down onto the vibrating plate 20 through a edge surface connecting the major upper and lower surfaces of the piezoelectric member 24 leaving an a gap from the common electrode 22 to insulate the individual electrode 26 from the common electrode 22.

According to this recording head, the ink 36 is directly pressured by the piezoelectric member 24, which results in a quick response to the image forming signal supplied between the electrodes to emit the ink-droplet and an increased force for emitting the ink-droplet.

A coating layer or film may be provided on the surface of the piezoelectric member 24 and the electrode 26 adjacent the ink cavity 14 to prevent the ink 36 from penetrating into the piezoelectric member 24.

The configuration of the piezoelectric member 24 is not limited thereto, but may be changed by alternating the corresponding configuration in the mold.

The coupling agent used for producing the piezoelectric actuator includes hydrophilic coupling agents having water solubility and water swellability, e.g., Na-carboxymethyl cellulose, and polyvinyl alcohol; hydrophilic coupling agents having water solubility and organic solvent solubility, e.g., hydroxypropyl cellulose, polyethylene glycol; and hydrophobic coupling agents having organic solvent solubility, e.g., ethyl cellulose; and polyvinyl acetate. The solvent may be suitably selected depending upon the coupling agent. Specifically, when using a hydrophilic coupling agent, a hydrophilic organic solvent, such as lower alcohol, for example propanol, and water may be used. Also, when using a hydrophobic coupling agent, a hydrophobic organic solvent, e.g., toluene, acetone, and xylene may be used.

Typical calcined power of the piezoelectric material includes a mixed powder $Pb(Zr_xTi_{x-1})O_3$ of lead zirconate and lead titanate, however, the present invention is not limited thereto, and other known various materials may be used.

Preferably, the powder of the piezoelectric material has a diameter of about 0.01–20 microns, more preferably about 0.015–13 microns.

The ratio of the piezoelectric material to solvent in the slurry is about 2:8 to 9:1 by wt, more preferably about 4:6 to 8:2 by wt.

The position of the ink outlet 16 and/or the configuration of the ink cavity etc. are not limited to the previous embodiments, they may be changed according to the various requirements.

Although the present invention has been fully described by way of examples with reference to the accompanying drawings, it is to be noted that various changes and modifications will be apparent to those skill in the art.

Therefore, unless otherwise such changes and modifications depart from the scope of the present invention, they should be construed as being included therein.

What is claimed is:

1. A piezoelectric vibrating structure, comprising:

a thin plate;

a first electrode formed on one portion of a surface of said thin plate;

a continuous piezoelectric layer disposed on said thin plate and covering said first electrode, said piezoelectric layer including a plurality of spaced-apart, parallel piezoelectric members and non-polarized connecting members disposed between and connecting said piezoelectric members, said piezoelectric members having a thickness which is greater than a thickness of said connecting members;

a plurality of second electrodes, each of said plurality of second electrodes being respectively arranged on a surface of one of said piezoelectric members, said surfaces that receive said plurality of second electrodes being opposite said first electrode;

wherein said continuous piezoelectric layer is formed by providing a slurry on said thin plate and covering said first electrode, said slurry being prepared by dispersing a calcined powder of piezoelectric material in a solvent containing dissolved coupling agent, drying said slurry to produce a green sheet, pressure molding said green sheet to produce a plurality of precursor members arranged at a predetermined space with connecting material therebetween, sintering said green sheet, and polarizing said sintered piezoelectric members by applying a voltage between said first and second electrodes.

2. A piezoelectric vibrating structure, comprising:

a thin plate made of nickel or stainless steel which comprises a first electrode;

a plurality of piezoelectric members arranged in parallel on said first electrode, wherein adjacent piezoelectric members are joined by non-polarized connecting members; and a plurality of second electrodes, each of said plurality of second electrodes being respectively arranged on a surface of one of said piezoelectric members, said surfaces that receive said plurality of second electrodes being opposite said first electrode;

wherein said piezoelectric members are formed by providing a slurry on said first electrode, said slurry being prepared by dispersing a calcined powder of piezoelectric material in a solvent containing dissolved coupling agent, drying said slurry to produce a green sheet, pressure molding said green sheet to produce a plurality of precursor members arranged at a predetermined space with connecting material therebetween, sintering said green sheet, and polarizing said piezoelectric members by applying a voltage between said first and second electrodes.

3. A piezoelectric vibrating structure as claimed in claim 1, wherein said first electrode comprises a plurality of electrode members spaced apart from each other, each of said electrode members corresponding to one of said plurality of second electrodes.

4. A piezoelectric vibrating structure, comprising:

a thin plate of electrically conductive material, said thin plate forming a first electrode;

a continuous piezoelectric layer disposed on said first electrode, said piezoelectric layer including a plurality of parallel, spaced-apart piezoelectric members and non-polarized connecting members disposed between and connecting said piezoelectric members, said piezoelectric members having a thickness which is greater than a thickness of said connecting members;

a plurality of second electrodes, each of said plurality of second electrodes being respectively arranged on a surface of one of said piezoelectric members, said surfaces that receive said plurality of second electrodes being opposite said first electrode;

wherein said continuous piezoelectric layer is formed by providing a slurry on said first electrode, said slurry being prepared by dispersing a calcined powder of piezoelectric material in a solvent containing dissolved coupling agent, drying said slurry to produce a green sheet, pressure molding said green sheet to produce a plurality of precursor members arranged at a predetermined space with connecting material therebetween, sintering said green sheet, and polarizing said sintered piezoelectric members by applying a voltage between said first and second electrodes.

5. A piezoelectric vibrating member, comprising:

a vibrating plate;

a first electrode disposed on a first surface of said vibrating plate;

a piezoelectric layer disposed on said first surface of said vibrating plate and covering said first electrode, said piezoelectric layer being a continuous layer having a plurality of spaced apart first portions and having non-polarized second portions which connect said first portions, said first portions of said piezoelectric layer having a thickness which is greater than a thickness of said second portions, said first portions being polarized; and a plurality of top electrodes, each of said plurality of top electrodes being arranged on a top surface of each respective one of said first portions of said piezoelectric layer, each said top surface being opposite said first electrode;

wherein an electric potential can be applied across said first electrode and any one of said top electrodes to form an electric field across a corresponding one of said first portions of said piezoelectric layer.

6. A piezoelectric member in accordance with claim 5, wherein said first electrode comprises a plurality of spaced apart electrode members, each of said plurality of electrode members confronting one of said first portions of said piezoelectric layer on a side opposite said top electrode.

7. A piezoelectric vibrating member, comprising:

a thin plate;

a plurality of spaced apart first electrodes arranged on a first surface of said thin plate;

a piezoelectric layer disposed on said first surface of said thin plate and covering said plurality of first electrodes, said piezoelectric layer being a continuous layer having a plurality of spaced apart first portions and having non-polarized second portions which connect the first portions, said first portions of said piezoelectric layer having a thickness which is greater than a thickness of said second portions, each of said first portions confronting and corresponding to one of said plurality of first electrodes; and a plurality of second electrodes, each of said plurality of second electrodes being arranged on a top surface of each respective one of said first portions of said piezoelectric layer, each said top surface being opposite a respective one of said plurality of spaced apart first electrodes;

wherein said first portions of said piezoelectric layer are polarized and wherein an electric potential can be applied across said any one of said first electrodes and a corresponding one of said second electrodes to form an electric field across a corresponding one of said first portions of said piezoelectric layer.

* * * * *

UNITED STATES PATENT AND TRADEMARK OFFICE
CERTIFICATE OF CORRECTION

PATENT NO.     : 6,198,203 B1                                                Page 1 of 3
DATED          : March 6, 2001
INVENTOR(S)    : Hideo Hotomi It is certified that error appears in the above-identified patent and that said Letters Patent is hereby corrected as shown below:

Title page,
Delete the exemplary figure in its entirety and insert the following therefor:

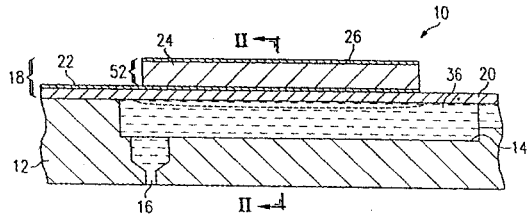

Drawings,
Sheet 1, delete Fig. 1 in its entirety and insert the following therefor:

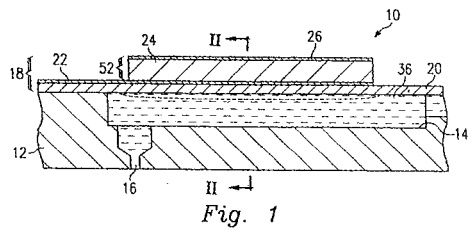
Fig. 1

Sheet 1, delete Fig. 2 in its entirety and insert the following therefor:

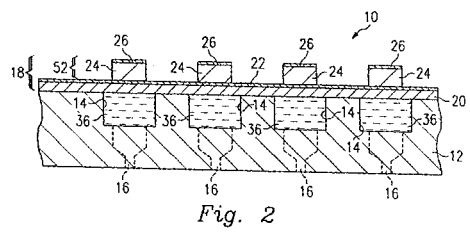
Fig. 2

Sheet 3, delete Step (H) of Fig. 4 and insert the following therefor:

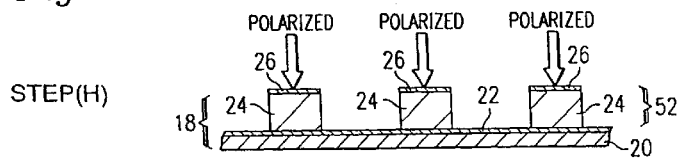
Fig. 4

UNITED STATES PATENT AND TRADEMARK OFFICE
CERTIFICATE OF CORRECTION

PATENT NO. : 6,198,203 B1  
DATED : March 6, 2001  
INVENTOR(S) : Hideo Hotomi

Figure 6:
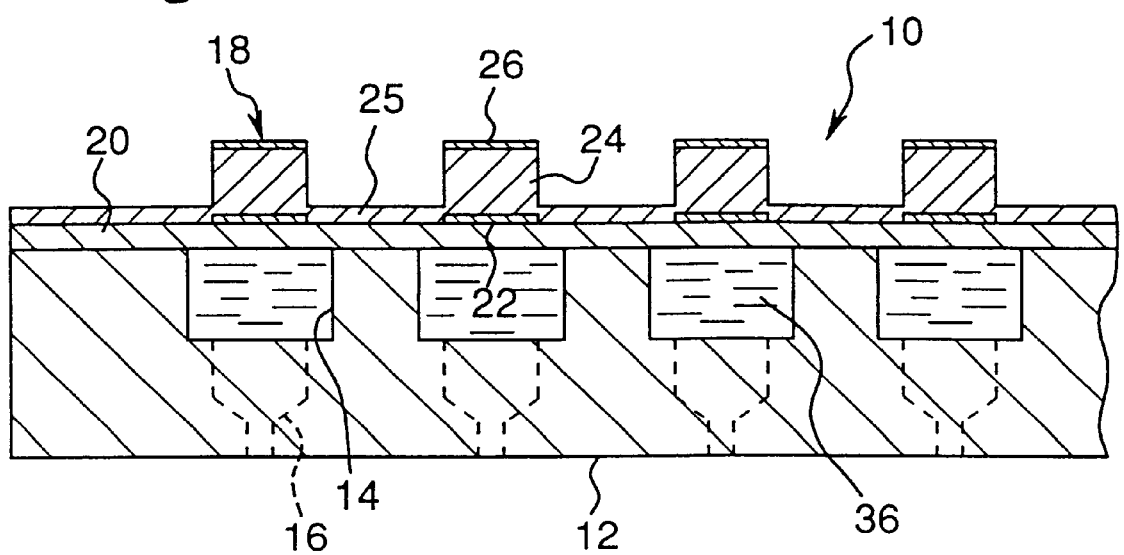
FIG. 6A is a transverse sectional view of the ink-jet recording head of the second embodiment.
FIG. 6B is an alternate transverse sectional view of the ink-jet recording head of the second embodiment.

It is certified that error appears in the above-identified patent and that said Letters Patent is hereby corrected as shown below:

Drawings (cont'd),
Sheet 4, delete Fig. 6 in its entirety and insert the following therefor:

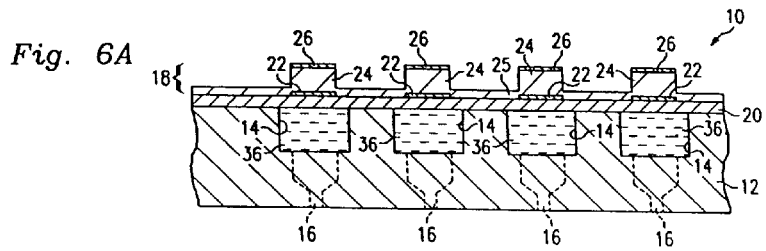

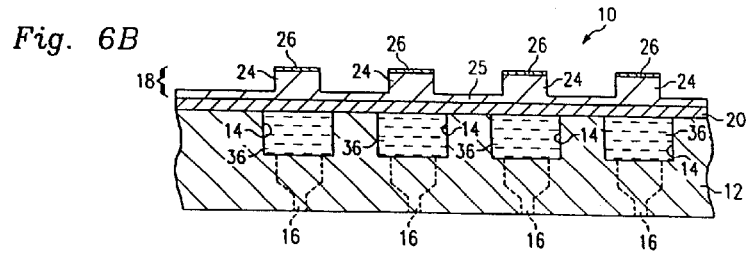

Sheet 5, delete Fig. 7 in its entirety and insert the following therefor:

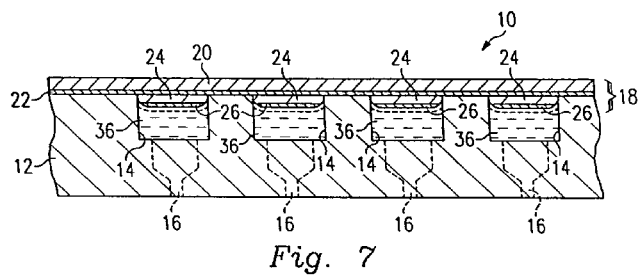

UNITED STATES PATENT AND TRADEMARK OFFICE
CERTIFICATE OF CORRECTION

PATENT NO. : 6,198,203 B1
DATED : March 6, 2001
INVENTOR(S) : Hideo Hotomi

It is certified that error appears in the above-identified patent and that said Letters Patent is hereby corrected as shown below:

Column 1,
Line 26, after "leading" insert -- to --.

Column 2,
Line 21, after "individual", delete "electrode,", and insert -- electrodes, --.

Column 3,
Line 58, after "obtain", delete "an" and insert -- a --.

Column 4,
Line 52, delete "introduce", and insert -- introduces --.

Column 5,
Line 16, delete "be".
Line 24, delete "head:", and insert -- head. --.
Line 44, after "leaving", delete "an".

Column 6,
Line 26, delete "skill", and insert -- skilled --.
Lines 27 and 28, delete "unless otherwise such changes and modifications depart", and insert -- unless such changes and modifications otherwise depart --.

Signed and Sealed this

Seventeenth Day of August, 2004

JON W. DUDAS
*Acting Director of the United States Patent and Trademark Office*